United States Patent [19]

Jun

[11] Patent Number: 5,756,397
[45] Date of Patent: May 26, 1998

[54] METHOD OF FABRICATING A WIRING IN A SEMICONDUCTOR DEVICE

[75] Inventor: Young Kwon Jun, Seoul, Rep. of Korea

[73] Assignee: LG Semicon Co., Ltd., Chungcheongbuk-Do, Rep. of Korea

[21] Appl. No.: 708,054

[22] Filed: Aug. 30, 1996

Related U.S. Application Data

[63] Continuation of Ser. No. 445,164, May 19, 1995, abandoned, which is a continuation of Ser. No. 173,982, Dec. 28, 1993, abandoned.

[51] Int. Cl.$^6$ .................................................. H01L 21/4763
[52] U.S. Cl. ........................... 438/624; 438/634; 438/639
[58] Field of Search .................................. 437/203, 195, 437/192, 164; 438/624, 634, 639

[56] References Cited

U.S. PATENT DOCUMENTS

| | | | |
|---|---|---|---|
| T887,018 | 6/1971 | Rodari | 437/164 |
| 4,176,016 | 11/1979 | Koel et al. | 204/38 R |
| 4,807,016 | 2/1989 | Douglas | 437/240 |
| 4,879,254 | 11/1989 | Tsuzuki et al. | 437/203 |
| 4,956,312 | 9/1990 | Van Laarhoven | 438/639 |
| 4,977,105 | 12/1990 | Okamoto et al. | 438/639 |
| 4,987,099 | 1/1991 | Flanner | 438/639 |
| 5,041,397 | 8/1991 | Kim et al. | 437/240 |
| 5,081,060 | 1/1992 | Kim | 438/639 |
| 5,117,273 | 5/1992 | Stark et al. | 438/639 |
| 5,120,679 | 6/1992 | Boardman et al. | 438/639 |
| 5,164,340 | 11/1992 | Chen et al. | 437/240 |
| 5,166,088 | 11/1992 | Ueda et al. | 437/240 |
| 5,200,880 | 4/1993 | Huang | 438/634 |
| 5,203,957 | 4/1993 | Yoo et al. | 156/643 |
| 5,227,014 | 7/1993 | Crotti et al. | 438/639 |
| 5,308,793 | 5/1994 | Tanaguchi et al. | 438/639 |
| 5,314,841 | 5/1994 | Brady et al. | 437/203 |
| 5,319,246 | 6/1994 | Nagamine et al. | |
| 5,330,934 | 7/1994 | Shibata et al. | 438/639 |
| 5,332,924 | 7/1994 | Kobayashi | |
| 5,362,676 | 11/1994 | Gordon et al. | 438/639 |
| 5,371,047 | 12/1994 | Greco et al. | 438/624 |
| 5,422,312 | 6/1995 | Lee et al. | 438/624 |
| 5,444,019 | 8/1995 | Chen et al. | 438/639 |
| 5,444,021 | 8/1995 | Chung et al. | 438/639 |
| 5,474,651 | 12/1995 | Huebner | 438/639 |
| 5,506,177 | 4/1996 | Kishimoto et al. | 438/624 |
| 5,534,461 | 7/1996 | Kuwajima | 438/639 |
| 5,552,344 | 9/1996 | Jang et al. | 438/624 |
| 5,612,254 | 3/1997 | Mu et al. | 438/634 |
| 5,635,423 | 6/1997 | Huang et al. | 438/624 |
| 5,656,530 | 8/1997 | Leary | 438/639 |

FOREIGN PATENT DOCUMENTS

| | | |
|---|---|---|
| 63-161648 | 7/1988 | Japan . |
| 64-82653 | 3/1989 | Japan . |
| 2-1917 | 1/1990 | Japan . |
| 2-178951 | 7/1990 | Japan . |

OTHER PUBLICATIONS

Article entitled "New Method of Making Al Single Crystal Interconnections On Amorphous Insulators" By J. Wada, K. Suguro, No. Hayasaka and H. Okano Presented at the 31ST Annual Proceedings of Reliability Physics 1993 at Atlanta, Georgia On Mar. 23-25, 1993.

*Primary Examiner*—Charles L. Bowers, Jr.
*Assistant Examiner*—Lynne A. Gurley
*Attorney, Agent, or Firm*—Morgan, Lewis & Bockius LLP

[57] ABSTRACT

A method of fabricating a wiring in a semiconductor device, including the steps of (1) forming an insulation film on a semiconductor substrate, (2) forming a groove lane having an inclined plane at an upper part thereof by etching the insulation film in a wiring region thereof, (3) forming a wiring film on the whole surface, and (4) etching the wiring film in the wiring region to form the wiring. The groove lane can be formed by etching the insulation film to form the lane and sputter etching the upper part of the lane using inert ions. The method can also include, before the forming the film step, forming an inter-insulation layer and an etch stopper.

8 Claims, 4 Drawing Sheets

F I G.2d
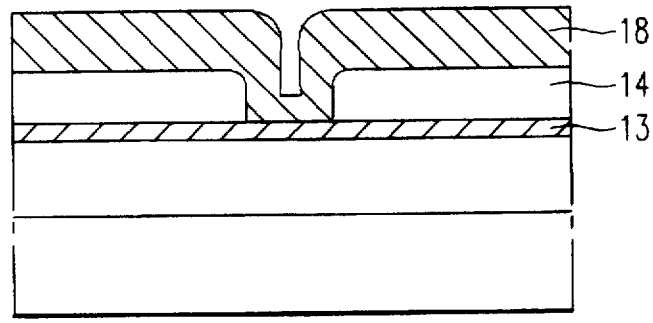
F I G.2e
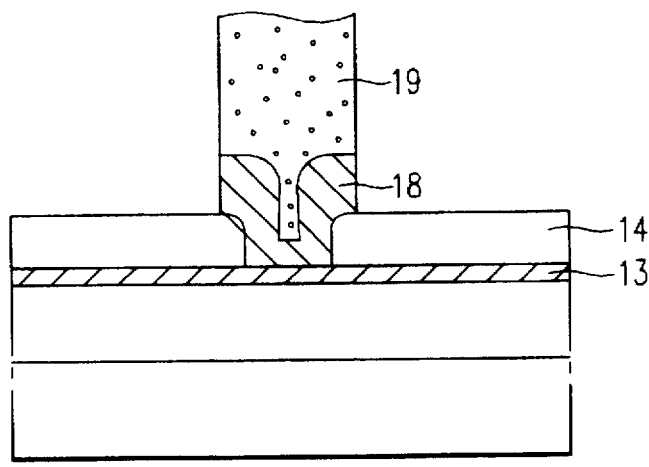
F I G.3
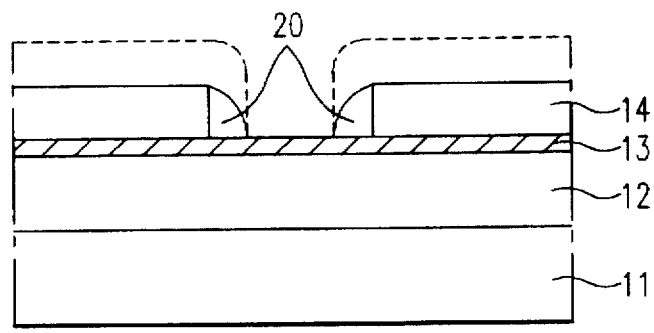

F I G.4
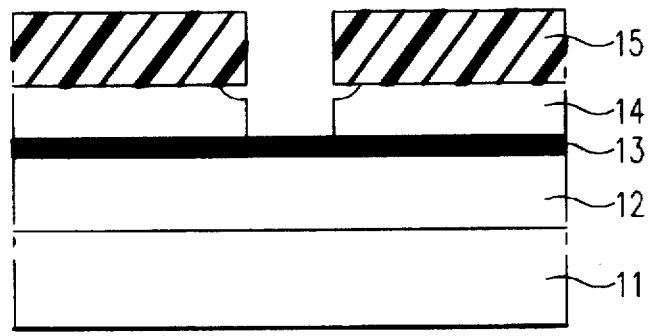
F I G.5a
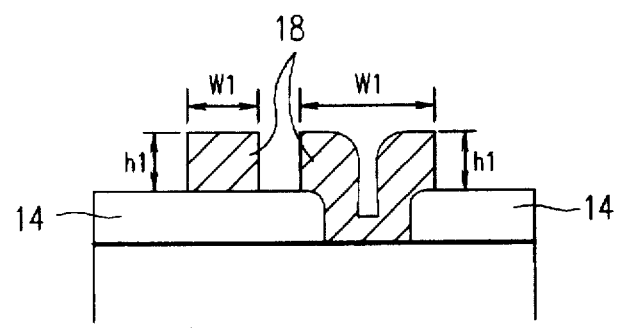
F I G.5b
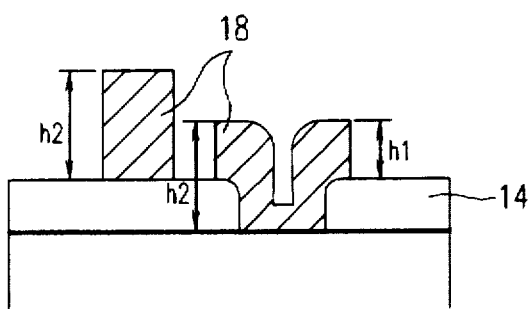

METHOD OF FABRICATING A WIRING IN A SEMICONDUCTOR DEVICE

This application is a continuation, of application Ser. No. 08/445,164, filed May 19, 1995, now abandoned; which is a continuation of application Ser. No. 08/173,982, filed Dec. 28, 1993, now abandoned.

FIELD OF THE INVENTION

This invention relates to a semiconductor device and a method of fabricating the same, and more particularly to a semiconductor device technique which is useful for reducing a wiring resistance and improving the reliability of the semiconductor device.

BACKGROUND OF THE INVENTION

Recently, the wiring width and thickness of the semiconductor device have been decreased according to the increase of the density of integration in the semiconductor device. Here, a problem is encountered that the reliability of the wiring is decreased by the failure of the wiring made of aluminum due to electromigration or stress migration.

To improve the reliability of aluminum, a technique has been proposed which makes the size of the grains of aluminum larger and improves the direction of the aluminum crystal so as to tolerate the electromigration and stress migration (Junichi Wada, et al., "New Method of Making Al single crystal interconnections on amorphous insulator", published in International Reliability Physics Symposium (IRPS)).

In this method the Al single crystal is used to form the wiring to tolerate the electromigration and stress migration.

FIGS. 1(a) to 1(c) illustrate the prior art fabrication process. As shown in FIG. 1(a), an oxide film 2 having a thickness of 1 μm is formed on a silicon substrate 1 having a (100) direction and grooves 3 are formed in the oxide film 2 at regular intervals by using Reactive Ion Etching (RIE) method. Here, the grooves 3 have a depth of 0.4 μm, a width of 0.6 μm and a pitch of 0.6 μm.

Aluminum film 4 having a thickness of 0.4 μm is deposited on the whole surface by using DC (direct current) magnetron sputtering under normal temperatures as shown in FIG. 1(b).

And, an in-situ heat treatment 5 is performed from bottom of the substrate 1 by using a halogen lamp heater where the temperature is set at 500 degrees C and the time at 45 seconds under Ar gas, as shown in FIG. 1(c)(Here, the in-situ heat treatment means that a constant heat treatment is performed, for depositing the aluminum film, in a vacuum in the sputtering chamber which is not broken, so that an oxide film is not formed on the aluminum wiring film.). Thereafter, the aluminum wiring film is patterned to a desired form to complete the wiring process.

As a result of forming the aluminum wiring film in the above processes, the aluminum wiring film filled in the grooves 3 is converted to the single crystal with the same orientation.

Accordingly, the single crystal aluminum having a high tolerance against the electromigration and stress migration can improve the reliability of the semiconductor device.

However, in the above technique, stability is degraded when the grooves are formed in the oxide film because the depth of the grooves are controlled by the etching time of the RIE method. Thus, there is a problem that a step coverage of aluminum filled in the grooves is degraded when the aluminum film is deposited by using the sputtering method, so that a uniform signle crystal of aluminum can not be obtained on the following process of the heat treatment. Also, there has been a problem in the reproduction due to the development of the slope of temperature around the grooves.

SUMMARY OF THE INVENTION

An object of this invention is to a semiconductor device and a method of producing the same which reduces a wiring resistance and improves the reliability of the semiconductor device.

This and other objects and features of this invention can be achieved by providing a semiconductor device comprising a semiconductor substrate, an insulation film formed on the substrate and including a groove having an inclined plane at upper part, and a wiring film formed on the groove of the insulation film in a length direction of the groove.

Also, a method of fabricating a semiconductor device may be provided comprising the steps of forming an insulation film on a semiconductor substrate, forming a groove having an inclined plane at upper part by etching the insulation film selectively, forming a wiring film on the whole surface, and etching the wiring film selectively to form the wiring.

BRIEF DESCRIPTION OF THE DRAWINGS

FIGS. 2(a) to 2(e) show process steps in accordance with an embodiment of this invention.

FIG. 3 shows a method of fabricating a semiconductor device in accordance with another embodiment of this invention.

FIG. 4 shows a method of fabricating a semiconductor device in accordance with another embodiment of this invention.

FIGS. 5(a) and 5(b) are sectional views for explaining the characteristics of the semiconductor device in accordance with this invention.

DETAILED DESCRIPTION OF THE INVENTION

FIG. 2(a) to 2(e) show a wire forming method of a semiconductor arranged in the sequence of processes in accordance with this invention.

Figure 1A:
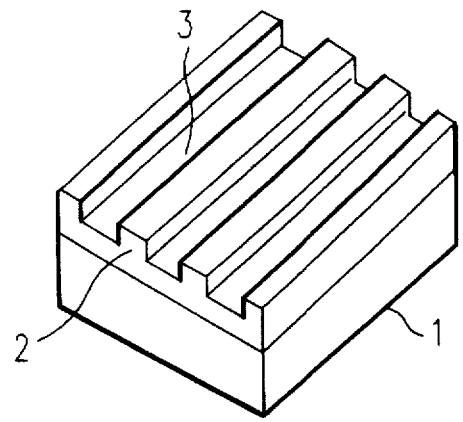
FIGS. 1(a) to 1(c) show conventional process steps of a semiconductor device.
Figure 1B:
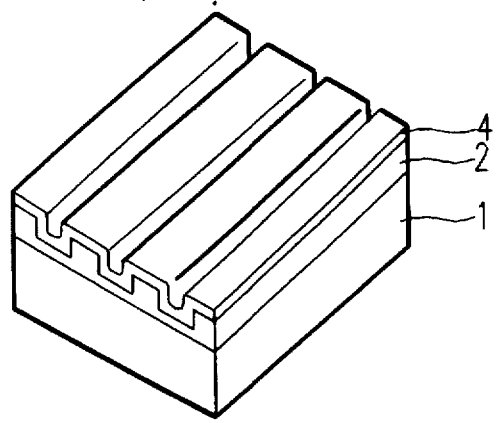
Figure 1C:
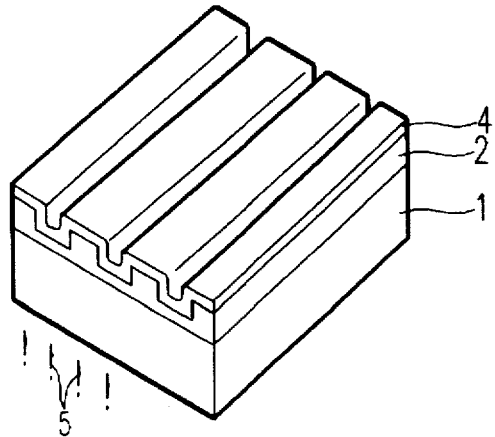
Figure 2A:
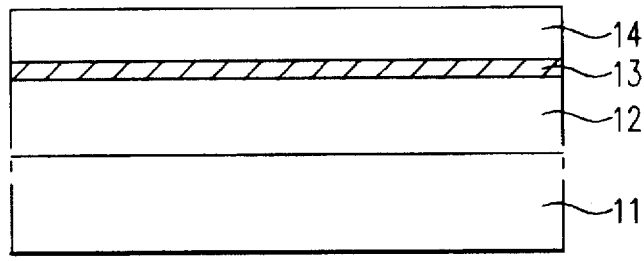

First, as shown in FIG. 2(a), for example an oxide film 12 as an inter-layer insulation film for separation with a wire or a conduction line on a semiconductor substrate 11 on which an element(not shown) has been formed is formed, and form an etch stopper film 13 is formed over the oxide film 12 to a thickness of 1000 to 2000 angstroms. The etch stopper film 13 is for use as an etch stopper in the process of dry etching of a supplementary insulation film to be formed over the etch stopper film in the following process, formed of a material having greater etch selectivity than the supplementary insulation film.

Then, a supplementary insulation film 14 over the etch stopper film 13 is formed to a thickness of 2000 to 5000 angstroms.

As for the supplementary insulation film, a silicon oxide film using $SiH_4$ gas and $O_2$ gas as reaction gases, or a nitride film using $NH_3$ gas and $SiH_4$ gas as reaction gases, as an inorganic insulation film, may be formed by deposition with PECVD (Plasma Enhanced Chemical Vapor Deposition)

method, and polyimide or PIQ may be coated with spin coating method as an organic insulation film.

At this time, when the supplementary insulation film is formed of a silicon oxide film, the etch stopper film 13 may be formed of a nitride film or an inorganic insulation film, and when the supplementary insulation film is formed of an organic insulation film, the etch stopper may be formed of an inorganic insulation film.

Figure 2B:
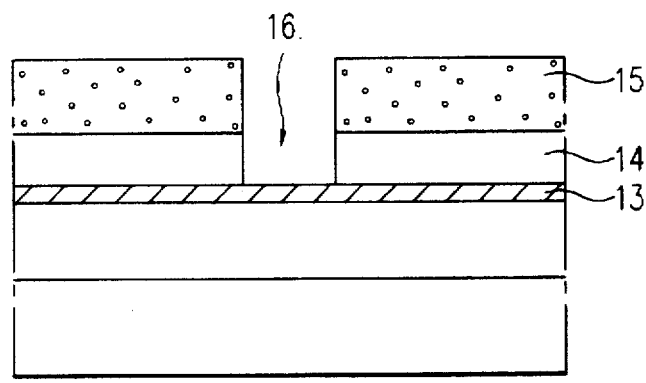

Next, as shown in FIG. 2(b), after coating photo resist 15 over the supplementary insulation film 14, patterning of the photo resist is carried out to a predetermined pattern utilizing general photolithography.

Then, dry etching of the supplementary insulation film utilizing the photo resist pattern as a mask is carried out to form a groove 16 in a wiring region of the supplementary insulation film.

At this time, as an etching process of the supplementary insulation film, dry etching process using gases of $CHF_3$ and $CF_4$ when the supplementary film is of a silicon oxide film, is carried out and using gases having F such as $SF_6$ and $CF_4$ when the supplementary film is of a nitride film, and etching with $O_2$ sputtering or $O_2$ plasma when the supplementary film is of an organic insulation film, is carried out when the etching stops at the etch stopper film 13.

Figure 2C:
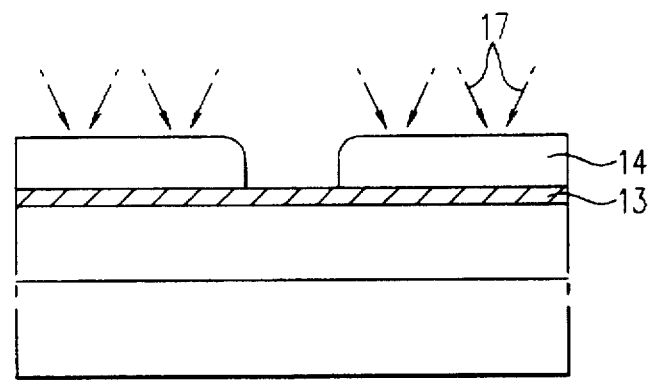

Next, as shown in FIG. 2(c), after removing the photo resist pattern used as the mask, sputter etch 17 is carried out using ions of inert gas of Ar+ etc to round off the upper edges of the groove formed in the supplementary insulation film 14.

Next, as shown in FIG. 2(d), Al 18 is deposited over the supplementary insulation film 14 such that the groove has been formed therein to a thickness of 4000 to 10000 angstroms with a RF bias or DC bias magnetron sputtering 17 at a pressure of 5 mm Torr using a common Al sputtering method, i.e., using Ar gas as a sputtering gas.

Next, as shown in FIG. 2(e), after coating photo resist 19 over the Al film 18, patterning to a predetermined pattern is carried out using common photo lithography techniques, and etching of the Al film 18 utilizing this photo resist pattern 19 as a mask to form a predetermined pattern of Al wiring is carried out.

In the meantime, another method for rounding off the upper edges of the groove formed in the supplementary insulation film in accordance with another embodiment of this invention is to be explained hereinafter, referring to FIG. 3.

After forming an inter-layer insulation film 12, an etch stopper film 13, and a supplementary insulation film 14 are formed successively on the semiconductor substrate 11 in the same processes with the processes of the FIGS. 2(a) and 2(b), a groove is formed in a predetermined part, an insulation film is deposited over the resultant and etching back is carried out to form insulation film side walls 20 on both sides of the groove.

By forming insulation film sides walls on both side of the groove formed in a supplementary insulation film as described above, the upper part of the grooves can be wider than the lower part naturally. The processes thereafter are identical with the processes shown in FIGS. 2(d) and 2(e).

Still another method for forming rounds at the upper edges of groove having formed in the supplementary insulation film in accordance with still another embodiment of this invention is to be explained hereinafter, referring to FIG. 4.

After forming an inter-layer film 12, an etch stopper film 13, and an supplementary insulation film 14 successively in accordance with the process shown in FIG. 2(a), a photo resist pattern 15 is formed over the supplementary insulation film 14 as shown in the process in FIG. 2(b).

Then, after carrying out a wet etching of the supplementary insulation film 14 utilizing the photo resist pattern 15 as a mask, dry etching is carried out to round off the upper part of the groove having formed in the supplementary insulation film as shown in FIG. 4.

At this time, a water solution containing HF etc. is used as a wet etching solution when the supplementary insulation film is of a silicon oxide film, a water solution containing $H_3PO_4$ etc is used when the supplementary insulation film is of a nitride film, and the water solution of a strong alkali or acetone is used when the supplementary insulation film is of an organic insulation film.

The features of the wiring formed in accordance with this invention as explained hereinbefore are to be explained hereinafter, referring to FIGS. 5(a) and 5(b).

First, as shown in FIG. 5(a), the wire structure in accordance with this invention [wire structure at right in FIG. 5(a)] has the advantage of having a larger actual surface area of a wire than that of the existing wire structure [wire structure at left in FIG. 5(a)] when the height h1 and the width w1 are the same.

Secondly, as shown in FIG. 5(b), the flattening process of the inter-layer insulation film following these processes become easier because the aspect ratio of the wire is decreased as the height of the wire is h1 <<h2 when the actual surface area of wires are the same.

According to this invention as described hereinbefore in detail, the resistance and reliability of a semiconductor can be improved, and the inter-layer flattening process following the wiring process can be carried out easily.

What is claimed is:

1. A method of fabricating a wiring film in a semiconductor device, comprising the steps of:

forming an inter-insulation film on a semiconductor substrate; forming a non-conductive etch stopper on the inter-insulation film;

forming a first insulation film on the etch stopper;

forming a groove by etching the first insulation film in a wiring region thereof, the groove extending along a top surface of the first insulation film, the groove having a length greater than a width, and wherein a bottom portion of the groove is separated from the semiconductor substrate by at least a top surface of the etch stopper and the inter-insulation film forming a second insulation film directly on the first insulation film including the groove;

forming insulation sidewall spacers on and directly contacting both sidewalls of the groove by etching the second insulation film; and forming the wiring film in the groove, the bottom portion of the groove remaining separated from the semiconductor substrate by at least the top surface of the etch stopper and the inter-insulation film, the wiring film contacting the etch stopper.

2. The method according to claim 1, wherein the step of forming the first insulating film includes Plasma Enhanced Chemical Vapor Deposition (PECVD).

3. The method according to claim 1, wherein the first insulating film includes one of an organic insulation film or inorganic insulation film.

4. The method according to claim 1, wherein the etch stopper has a etch selectivity greater than the first insulating layer.

5. A method of fabricating a wiring film in a semiconductor device having a semiconductor substrate, the method comprising the steps of:

forming a first insulation film on the semiconductor substrate;

forming a second insulating film including a nonconductive etch stopper on the first insulating film;

forming a third insulating film on the second insulating film;

forming a groove over the substrate to define a wiring region thereof, the groove extending along a top surface of the third insulation film and having a length greater than a width, and wherein a bottom portion of the groove is separated from the semiconductor substrate by at least a top surface of the etch stopper and the first insulation film;

forming a fourth insulating film directly on the third insulation film including the groove;

etching the fourth insulation film to form sidewall spacers on and directly contacting both sidewalls of the groove; and forming the wiring film in the groove, the wiring film contacting the second insulating film;

wherein the bottom portion of the groove remains separated from the semiconductor substrate by at least the top surface of the etch stopper and the first insulation film, the wiring film, contacting the etch stopper after formation of the wiring film.

6. The method according to claim 5, wherein the step of forming the third insulating film includes plasma enhanced chemical vapor deposition (PECVD).

7. The method according to claim 5, wherein the third insulating film includes one of an organic insulation film or inorganic insulation film.

8. The method according to claim 5, wherein the etch stopper has a etch selectivity greater than the first insulating layer.

* * * * *